US008835310B2

(12) United States Patent
Barabash et al.

(10) Patent No.: US 8,835,310 B2
(45) Date of Patent: Sep. 16, 2014

(54) TWO STEP DEPOSITION OF MOLYBDENUM DIOXIDE ELECTRODE FOR HIGH QUALITY DIELECTRIC STACKS

(71) Applicant: Intermolecular, Inc., San Jose, CA (US)

(72) Inventors: Sergey Barabash, San Jose, CA (US); Dipankar Pramanik, Saratoga, CA (US); Xuena Zhang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/725,701

(22) Filed: Dec. 21, 2012

(65) Prior Publication Data

US 2014/0175604 A1    Jun. 26, 2014

(51) Int. Cl.
*H01L 21/4763*    (2006.01)
*H01L 49/02*    (2006.01)

(52) U.S. Cl.
CPC ............. *H01L 28/55* (2013.01); *H01L 28/60* (2013.01)
USPC ........... 438/648; 438/656; 438/683; 438/685; 257/763; 257/764

(58) Field of Classification Search
CPC ...... H01L 28/40; H01L 23/5223; H01L 45/00
USPC .......... 438/648, 656, 683, 685; 257/763, 764, 257/532
See application file for complete search history.

(56) References Cited

U.S. PATENT DOCUMENTS

| 3,581,161 | A  | * | 5/1971  | Cunningham et al. ........ 257/763 |
| 5,099,388 | A  |   | 3/1992  | Ogawa et al. |
| 5,187,638 | A  |   | 2/1993  | Sandhu et al. |
| 5,590,017 | A  |   | 12/1996 | Kelso |
| 7,582,893 | B2 |   | 9/2009  | Sokolik et al. |
| 8,415,194 | B2 | * | 4/2013  | Krasnov et al. ................. 438/69 |
| 8,415,657 | B2 |   | 4/2013  | Rui et al. |
| 2008/0308156 | A1 | * | 12/2008 | Boyer, Jr. ..................... 136/262 |
| 2009/0072723 | A1 | * | 3/2009  | Shioya .......................... 313/504 |
| 2010/0322221 | A1 | * | 12/2010 | Tanimoto ...................... 370/338 |

* cited by examiner

*Primary Examiner* — Andy Huynh

(57) ABSTRACT

Electrodes, which contain molybdenum dioxide ($MoO_2$) can be used in electronic components, such as memory or logic devices. The molybdenum-dioxide containing electrodes can also have little or no molybdenum element, together with a portion of molybdenum oxide, e.g., $MoO_x$ with x between 2 and 3. The molybdenum oxide can be present as molybdenum trioxide $MoO_3$, or in Magneli phases, such as $Mo_4O_{11}$, $Mo_8O_{23}$, or $Mo_9O_{26}$. The molybdenum-dioxide containing electrodes can be formed by annealing a multilayer including a layer of molybdenum and a layer of molybdenum oxide. The oxygen content of the multilayer can be configured to completely, or substantially completely, react with molybdenum to form molybdenum dioxide, together with leaving a small excess amount of molybdenum oxide $MoO_x$ with x>2.

12 Claims, 9 Drawing Sheets

TWO STEP DEPOSITION OF MOLYBDENUM DIOXIDE ELECTRODE FOR HIGH QUALITY DIELECTRIC STACKS

FIELD OF THE INVENTION

This invention relates generally to electrodes, and more particularly, to electrodes for memory devices and transistor gate stacks.

BACKGROUND

Memory elements are used in electronic systems, including volatile memories such as dynamic random access memory (DRAM), or non volatile memory such as electrically-erasable programmable read only memory (EPROM). A memory element can include a dielectric layer sandwiched between two conductor layers, acting as electrodes for the memory element.

In general, the use of electrodes with high work function can decrease leakage in high dielectric constant (e.g., high-k) dielectric stacks. Conducting materials with high work function include molybdenum dioxide ($MoO_2$) and metallic molybdenum (Mo). However, Mo is subject to oxidation during heat treatment and/or device operation, which may promote formation of oxygen vacancies in the dielectric layer, which may deteriorate the quality of the dielectric. On the other hand, deposition of $MoO_2$ can generate a significant amount of $MoO_3$, which is an insulator, and can degrade the conductivity of the $MoO_2$ electrodes.

For example, during an atomic layer deposition (ALD) of $MoO_2$, it is often found that $MoO_3$ forms instead of $MoO_2$ for a wide range of experimental conditions. It is possible to convert $MoO_3$ to $MoO_2$ with a post-treatment in an external reducing environment. However, such post-treatment may be undesirable. For example, such a post-treatment may deteriorate the quality of the dielectric underlayer.

Therefore, there is a need for molybdenum-containing electrodes that can meet the design criteria for advanced memory devices.

SUMMARY

In some embodiments, methods, and devices fabricated from methods, to form molybdenum-containing electrodes are provided. The molybdenum-containing electrodes can include molybdenum dioxide ($MoO_2$), which can provide high electrical conductivity.

In some embodiments, a layer of molybdenum can be formed next to a layer of molybdenum oxide, e.g., molybdenum trioxide or Magnéli phase molybdenum oxide. The molybdenum oxide layer can be disposed next to a dielectric layer, such as a metal oxide dielectric layer. The layers can be annealed to form a composite layer, by reacting molybdenum with molybdenum oxide to form molybdenum dioxide. The composite layer can have high conductivity, acting as an electrode for the dielectric layer.

In some embodiments, non-uniform layer of molybdenum or molybdenum oxide can be formed next to a dielectric layer. The thicker portion of the molybdenum oxide, or the thinner portion of the molybdenum layer, can leave excess molybdenum oxide at the interface with the dielectric layer. The thicker portion of the molybdenum oxide, or the thinner portion of the molybdenum layer, can be configured to position at a less critical contact resistance area, to reduce the effect of poor contact resistance due to the presence of molybdenum oxide at the interface.

In some embodiments, the molybdenum-containing electrodes can contain a minimum molybdenum amount (e.g., less than 5 wt %), or contain no molybdenum element at all. In some embodiments, the molybdenum-containing electrodes can contain molybdenum oxide, e.g., $MoO_x$ with x between 2 and 3, such as at less than 20 wt %. The molybdenum oxide can be present as molybdenum trioxide, or in Magnéli phases, such as $Mo_4O_{11}$, $Mo_8O_{23}$, or $Mo_9O_{26}$.

In some embodiments, the molybdenum-containing electrodes can be used in memory devices or as gate stacks in transistor logic devices.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1A:
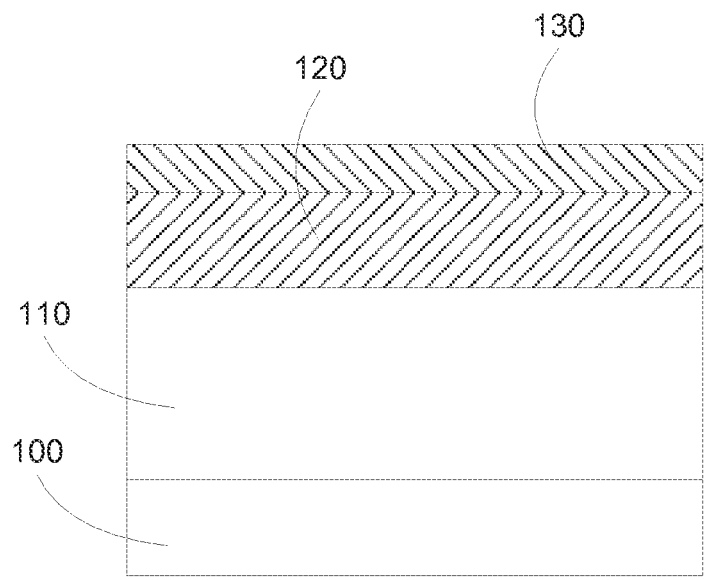
FIGS. 1A-1B illustrate a schematic representation of a ReRAM operation according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, methods, and devices fabricated from methods, to form molybdenum-containing electrodes are provided, such as top electrodes, e.g., electrodes that are positioned on a dielectric layer. The molybdenum-containing electrodes can include molybdenum dioxide ($MoO_2$), which can provide high electrical conductivity.

In some embodiments, the methods to form molybdenum dioxide electrode can include depositing a layer containing molybdenum and molybdenum oxide, such as $MoO_x$ with x between 2 and 3. Molybdenum dioxide can be difficult to deposit, since during the deposition of molybdenum dioxide, it is often found that molybdenum trioxide forms instead of molybdenum dioxide for a wide range of deposition conditions. Molybdenum trioxide can be converted to molybdenum dioxide with a port treatment in a reduced environment. However, such as treatment may have some adverse effect. for example, deteriorating the quality of a dielectric underlayer.

Thus in some embodiments, methods to form molybdenum dioxide electrodes are provided, offering wide process windows with reduced damage to a underlayer. The methods can include depositing layers containing molybdenum and molybdenum oxide so that the number of oxygen atoms in the layers is sufficient to form molybdenum dioxide for the elemental molybdenum and for the molybdenum atoms in molybdenum oxide. For example, molybdenum oxide can be converted to molybdenum dioxide with some excess oxygen atoms. The excess oxygen atoms should be sufficient to oxidize molybdenum to molybdenum dioxide. Thus molybdenum dioxide layer can be formed, from deposited layers of molybdenum and molybdenum oxide.

In some embodiments, the methods can include depositing a layer of elemental molybdenum on a layer of molybdenum oxide, such as $MoO_x$ with x between 2 and 3, including molybdenum trioxide, and then subjecting the deposited layers to a post treatment of a non-reducing ambient, e.g., oxidation, inert or non-reactive ambient, to convert molybdenum and molybdenum oxide to molybdenum dioxide.

The molybdenum dioxide electrodes fabricated from the methods can be used in memory elements, such as dynamic random access memory (DRAM). For example, the memory elements can include a dielectric layer, such as a metal oxide layer (e.g., $TiO_2$, $Al_2O_3$, $HfO_2$, etc.), sandwiched between two electrode layers. The dielectric layer can contain a high dielectric constant (high-k) material, e.g., materials that have dielectric constant greater than that of silicon dioxide ($SiO_2$). The molybdenum dioxide electrodes fabricated from the methods can also be used as gate conductor in a gate stack for transistor devices.

In some embodiments, methods to form molybdenum-containing electrodes are provided. A layer of molybdenum can be formed next to a layer of molybdenum oxide, e.g., $MoO_x$ with x between 2 and 3. The molybdenum oxide layer can be disposed next to a dielectric layer, such as a metal oxide dielectric layer. The molybdenum layer can be disposed away from the dielectric. The layers can be annealed to form a composite layer, by reacting molybdenum with molybdenum oxide to form molybdenum dioxide. The composite layer can have high conductivity, acting as an electrode for the dielectric layer.

Figure 1B:
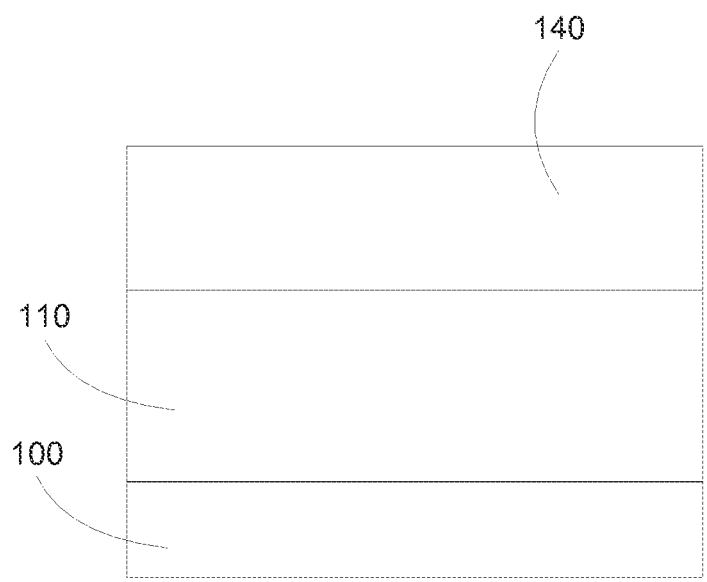

FIGS. 1A-1B illustrate a process flow for forming an electrode according to some embodiments. In FIG. 1A, a dielectric layer 110 can be formed, e.g., deposited, on a substrate 100. The dielectric layer 110 can be formed directly on the substrate, e.g., in contact with the substrate. Alternatively, there can be other layers between the dielectric layer 110 and the substrate 100, such as a bottom electrode. A layer 120 containing molybdenum oxide, such as $MoO_x$ with x between 2 and 3, including molybdenum trioxide $MoO_3$ or a Magnéli phase molybdenum oxide (e.g., $Mo_4O_{11}$, $Mo_8O_{23}$, or $Mo_9O_{26}$), can be formed on the dielectric layer 110, to be in contact with the dielectric layer 110. A layer 130 containing elemental molybdenum can be formed on the layer 120, to be in contact with the layer 120.

The substrate and the layers formed thereon can be annealed, for example, to react molybdenum oxide in layer 120 with molybdenum in layer 130. In FIG. 1B, molybdenum dioxide 140 can be formed due to the reaction between molybdenum oxide in layer 120 and molybdenum in layer 130.

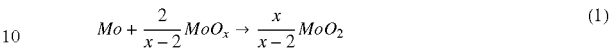

$$Mo + \frac{2}{x-2} MoO_x \rightarrow \frac{x}{x-2} MoO_2 \qquad (1)$$

In some embodiments, the ratio of molybdenum atoms in $MoO_x$ and of elemental Mo can be chosen, e.g., to be $$\frac{2}{x-2},$$

so that the above reaction can be completed, e.g., Mo or $MoO_x$ can be reacted completely to form $MoO_2$ without any excess Mo or $MoO_x$. For example, for x=3, e.g., molybdenum oxide is molybdenum trioxide, the mole ratio of $MoO_3$ and Mo can be 2.

In some embodiments, the heat treatment can be performed in an inert, non-reactive, or oxidation ambient. In some embodiments, a cap layer, e.g., a layer of silicon nitride, can be formed on the Mo layer 130 to prevent oxidation of the molybdenum.

In some embodiments, the amount of elemental molybdenum is configured to be completely, or substantially completely, consumed in the reaction with molybdenum oxide. The lack of elemental molybdenum, or the presence of elemental molybdenum in a small amount (e.g., less than 1 at %) can reduce the potential generation of oxygen with high chemical potential, eliminating or reducing the formation of oxygen vacancy in a dielectric layer disposed next to the composite layer.

In some embodiments, excess molybdenum oxide can be present in the composite layer. The presence of molybdenum oxide generate oxygen with low chemical potential, thus can essentially not affecting the dielectric layer, for example, because of the small probability of forming oxygen vacancy in a dielectric layer due to the low chemical potential. The excess molybdenum oxide can be less than about 5 at % of the total composite layer. The excess molybdenum oxide can be distributed within the composite layer. In some embodiments, the excess molybdenum oxide can be positioned at the interface with the dielectric, such as less than half of the interface area to not affecting the contact resistance with the dielectric layer.

Figure 2A:
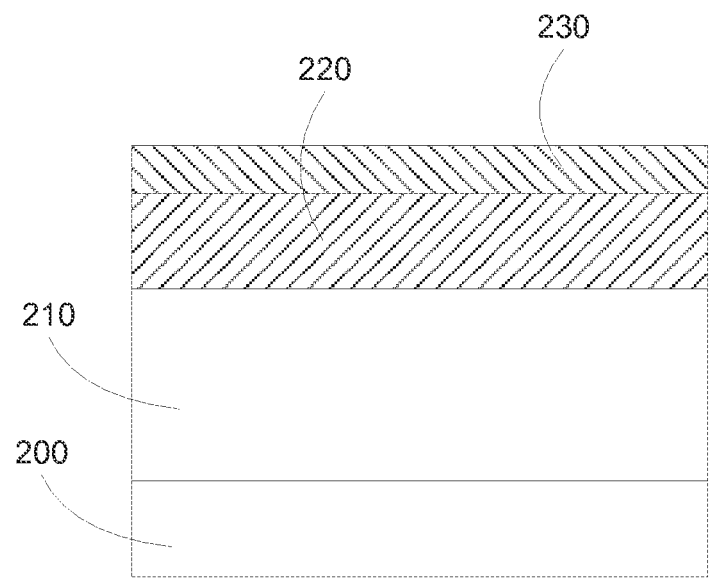
FIGS. 2A-2B illustrate memory devices according to some embodiments.
Figure 2B:
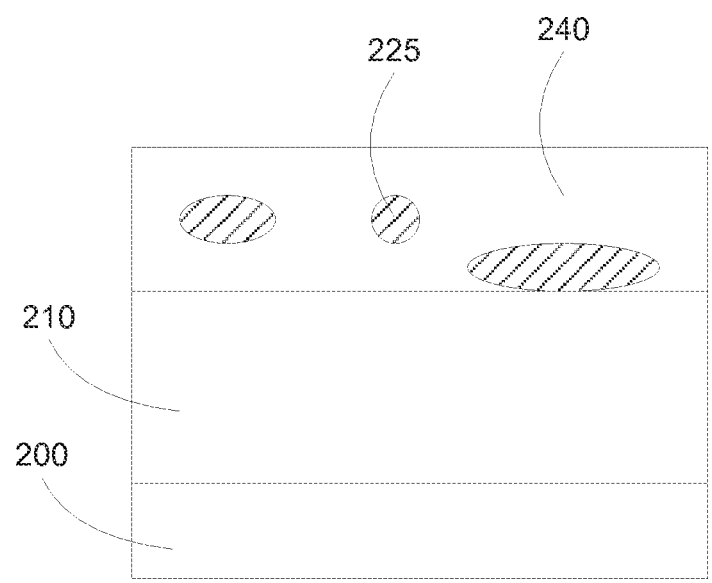

FIGS. 2A-2B illustrate a process flow for forming an electrode according to some embodiments. In FIG. 2A, a dielectric layer 210 can be formed, e.g., deposited, on a substrate 200. The dielectric layer 210 can be formed directly on the substrate, e.g., in contact with the substrate. Alternatively, there can be other layers between the dielectric layer 210 and the substrate 200, such as a bottom electrode. A layer 220 containing molybdenum oxide, such as $MoO_x$ with x between 2 and 3, including molybdenum trioxide $MoO_3$ or a Magnéli phase molybdenum oxide (e.g., $Mo_4O_{11}$, $Mo_8O_{23}$, or $Mo_9O_{26}$), can be formed on the dielectric layer 210, to be in contact with the dielectric layer 210. A layer 230 containing molybdenum can be formed on the layer 220, to be in contact with the layer 220.

The substrate and the layers formed thereon can be annealed, for example, to react molybdenum oxide in layer 220 with molybdenum in layer 230. In FIG. 2B, molybdenum dioxide 240 can be formed due to the reaction between molybdenum oxide in layer 220 and molybdenum in layer 230. There can be molybdenum oxide 225 remained in the composite layer 240, e.g., the layer formed from a combination of the layers 220 and 230. For example, if the layer 220 is a molybdenum trioxide layer, and the number of molybdenum atoms in the layer 220 is larger than twice the number of molybdenum atoms in layer 230, there can be excess molybdenum trioxide formed after a reaction between layers 220 and 230.

After the heat treatment, the amount of excess $MoO_3$ can be too small to affect the device operation. Any excess Mo (if any) can diffuse into or react with ambient materials, e.g., oxygen in the ambient during the anneal process, and might not affect the state of chemical equilibrium at the $MoO_2$/dielectric boundary.

In some embodiments, molybdenum trioxide can react with the newly generated molybdenum dioxide to form Magnéli phases of molybdenum oxide. For example, Magnéli phase $Mo_4O_{11}$ can be formed according to the reaction

$$6MoO_2 + 18MoO_3 \rightarrow 6Mo_4O_{11} \quad (2)$$

The Magnéli phase can thus alter the excess amount of molybdenum trioxide, and instead providing an excess amount of Magnéli phase molybdenum oxide, e.g., $Mo_4O_{11}$. The amount of initial molybdenum trioxide can be reduced by up to about 20% as compared to a process without the formation of the Magneli phase.

In some embodiments, other process condition can affect the reactions, e.g., reactions 1, 2, or other Magnéli phases can be formed, thus the amount of initial molybdenum trioxide can be less than ideally calculated.

In some embodiments, bulk molybdenum dioxide phase can allow some off-stoichiometry, for example, up from $MoO_2$ to about $MoO_{2.1}$ composition. Thus the mount of molybdenum oxide can be higher than ideally calculated.

In some embodiments, some excess molybdenum trioxide can be allowed. For example, up to about half a monolayer of molybdenum trioxide can be present at the interface between the electrode and the dielectric layer without significantly affect the contact resistance. The amount of molybdenum trioxide can be up to half a monolayer more, to account for the excess molybdenum trioxide at the interface.

In some embodiments, the amount of molybdenum atoms in the molybdenum trioxide is between 200% and 210%+half a monolayer of molybdenum, as compared to the amount of molybdenum in the molybdenum layer. In some embodiments, the amount of molybdenum trioxide is between 200% and 250%.

A reason for the formation of molybdenum dioxide from molybdenum oxide and elemental molybdenum is that the formation energy for molybdenum dioxide is lower than that of molybdenum oxide and elemental molybdenum.

Figure 3:
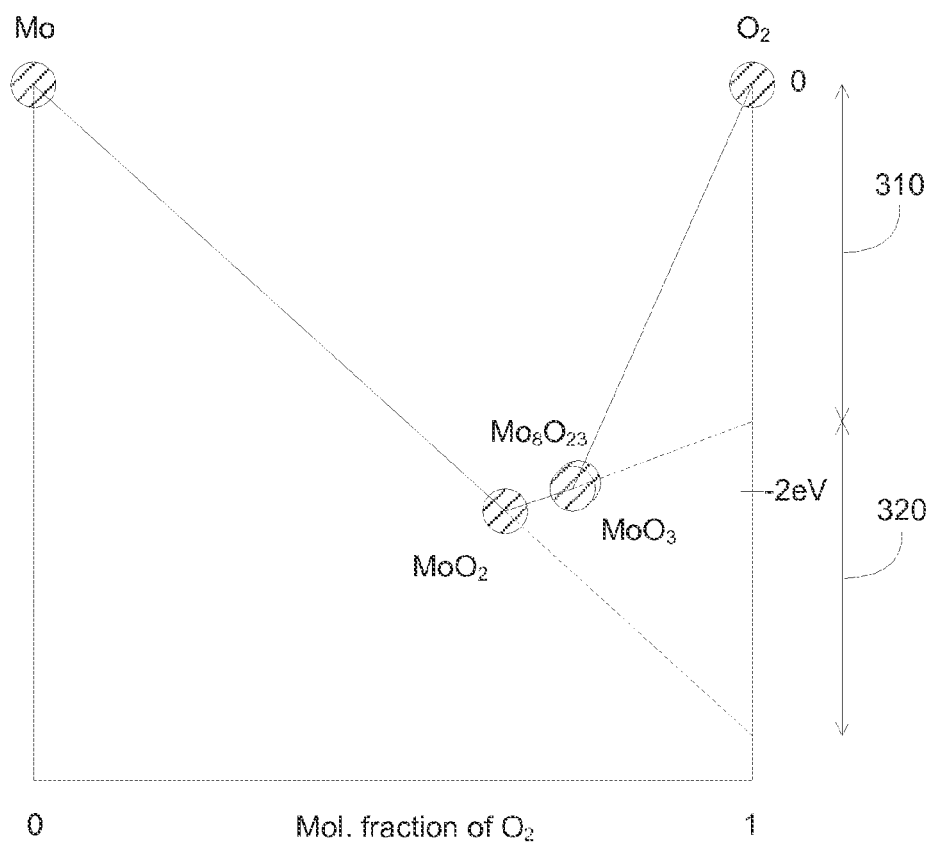
FIG. 3 illustrates a phase diagram of molybdenum dioxide and molybdenum trioxide according to some embodiments.

FIG. 3 illustrates a simplified formation energy schematic of molybdenum dioxide and molybdenum oxide using first principles calculations according to some embodiments. The horizontal axis can show the molar fraction of oxygen in a molybdenum oxide $MoO_x$ compound. For example, at 0% molar fraction of oxygen, the compound contains pure molybdenum element Mo. At 100% molar fraction of oxygen, the compound is pure oxygen, or $O_2$. At 66.7% molar fraction of oxygen, there is two oxygen atoms per molybdenum atom, or molybdenum dioxide $MoO_2$. At 75% molar fraction of oxygen, there is three oxygen atoms per molybdenum atom, or molybdenum trioxide $MoO_3$. The vertical axis shows the chemical potential of oxygen atom. At pure oxygen, the chemical potential of oxygen is 0 eV by definition.

As can be seen, the formation energy of $MoO_2$ is lower than that of other phases of molybdenum oxide, such as molybdenum trioxide or other Magneli phase (Magneli phase $Mo_8O_{23}$ is shown in the graph as an example)

In some embodiments, electrodes in a dielectric-electrode stack, for example, in a memory device, can include molybdenum dioxide together with a small portion of molybdenum trioxide and without substantial amount of molybdenum. The absence of molybdenum can prevent low chemical potential oxygen formation, leading to minimal oxygen vacancy formation in the dielectric. The presence of molybdenum trioxide can shift the phase diagram curve, leading to higher chemical potential of oxygen, reducing the probability of oxygen vacancy formation in the dielectric.

Molybdenum trioxide is an insulator material, thus minimal amount of molybdenum trioxide can be used. For example, the amount of molybdenum trioxide can be an optimization between oxygen vacancy formation of the dielectric and electrical conductivity of the electrodes. In some embodiments, the amount of molybdenum trioxide can be less than 5 at %. Molybdenum trioxide can be configured to be at less critical contact area portion of the interface between the electrodes and the dielectric, reducing the potential of having high contact resistance between the electrodes and the dielectric.

In some embodiments, the electrodes can contain molybdenum dioxide and a molybdenum oxide, e.g., $MoO_x$ with x between 2 and 3. The molybdenum oxide can be present in Magnéli phases, such as $Mo_4O_{11}$, $Mo_8O_{23}$, or $Mo_9O_{26}$. Magnéli phase molybdenum oxide can be poorly conductive, e.g., much lower conductivity as compared to molybdenum dioxide, but can have much better conductance than the insulator molybdenum trioxide. Also, similar to molybdenum trioxide, Magnéli phase molybdenum oxide can create oxygen with low chemical potential, thus can reduce possibility of oxygen vacancy formation in the dielectric layer.

Figure 4A:
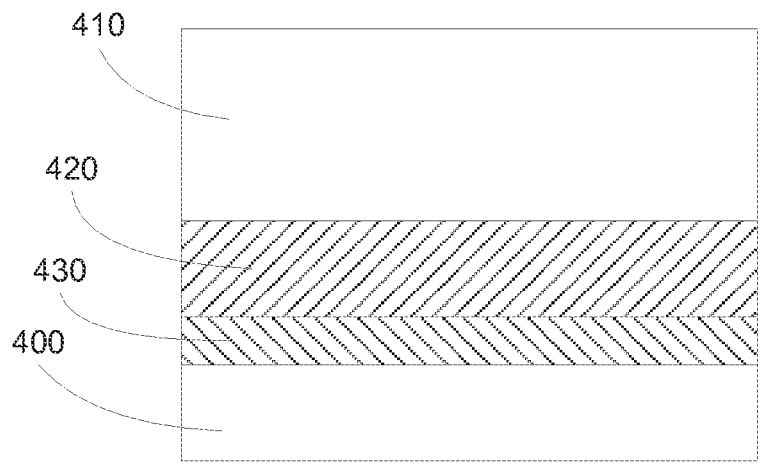
FIGS. 4A-4B illustrate a phase diagram of molybdenum dioxide and molybdenum oxide $Mo_8O_{23}$ according to some embodiments.
Figure 4B:
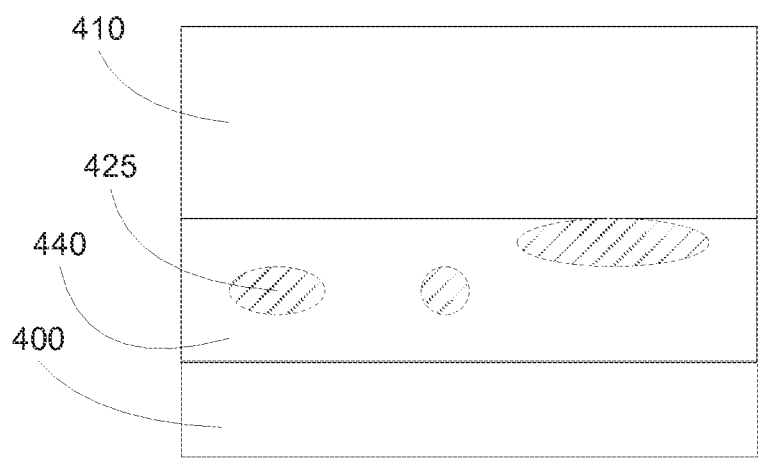

FIGS. 4A-4B illustrate a process flow for forming an electrode according to some embodiments. In FIG. 4A, a layer 430 containing molybdenum can be formed on a substrate 400. The layer 430 can be formed directly on the substrate, e.g., in contact with the substrate. Alternatively, there can be other layers between the layer 430 and the substrate 400, such as other device layers. A layer 420 containing molybdenum oxide, such as $MoO_x$ with x between 2 and 3, including molybdenum trioxide $MoO_3$ or a Magneli phase molybdenum oxide (e.g., $Mo_4O_{11}$, $Mo_8O_{23}$, or $Mo_9O_{26}$), can be formed on the layer 430, to be in contact with the layer 430. A dielectric layer 410 can be formed, e.g., deposited, on the layer 420, to be in contact with the layer 420.

The substrate and the layers formed thereon can be annealed, for example, to react molybdenum oxide in layer 420 with molybdenum in layer 430. In FIG. 4B, molybdenum dioxide 440 can be formed due to the reaction between molybdenum oxide in layer 420 and molybdenum in layer 430.

In some embodiments, the amount of molybdenum elements in the layer 420 and 430 is such that the reaction between layers 420 and 430 is complete. In some embodiments, there can be excess molybdenum oxide 425 in the composite layer, e.g., the layer formed from a combination of the layers 420 and 430.

In some embodiments, non-uniform layer of molybdenum or molybdenum oxide can be formed next to a dielectric layer. The thicker portion of the molybdenum oxide, or the thinner portion of the molybdenum layer, can leave excess molybdenum oxide at the interface with the dielectric layer. The thicker portion of the molybdenum oxide, or the thinner portion of the molybdenum layer, can be configured to position at a less critical contact resistance area, to reduce the effect of poor contact resistance due to the presence of molybdenum oxide at the interface.

A reason for making Mo layer slightly thinner and/or $MoO_3$ layer slightly thicker in the regions where good electrical quality of the electrode is not essential is that this can maximize the amount of the residual $MoO_3$ phase in the regions where the good electrical contact is not important, and thus allows to minimize the need for $MoO_3$ remaining in the regions where the good contact is important. In some embodiments, the dimension of the thicker, thinner, and critical contact resistance can be optimized with respect to the diffusion length of $MoO_3$ clusters in a matrix of $MoO_2$. For example, let/be the average distance at which the oxygen atoms diffuse during the thermal treatment. To provide a uniform distribution of oxygen chemical potential in the electrode, and little or no unreacted Mo is left in the regions away from such $MoO_3$ regions, the non uniform thickness can be configured so that they are smaller than l, in order to establish chemical equilibrium between them. Further, to ensure that such $MoO_3$ centers do not diffuse away from the intended positions due to strain or temperature gradients, the dimension can be comparable to l, e.g., not exceeding it by orders of magnitude.

Figure 5A:
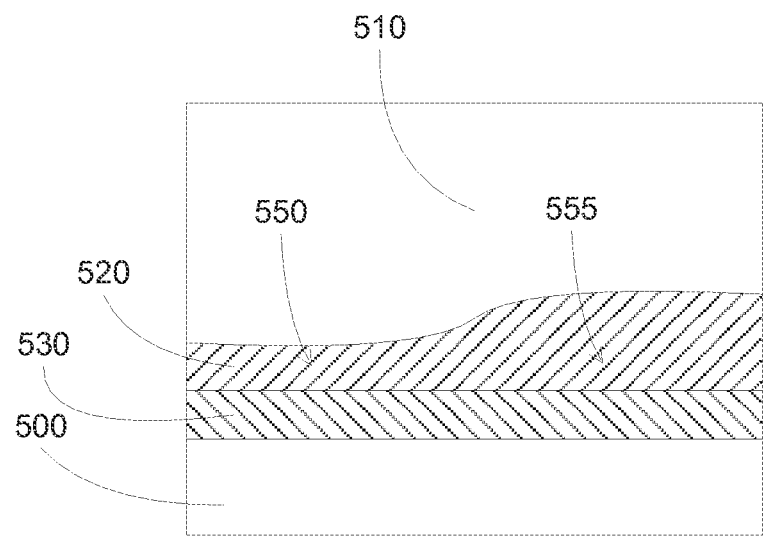
FIGS. 5A-5B illustrate a process flow for forming an electrode according to some embodiments.
Figure 5B:
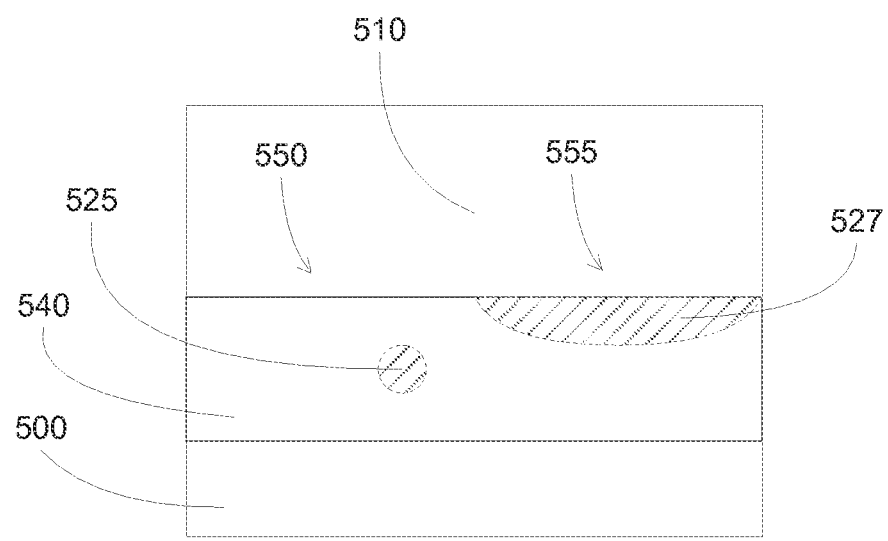

FIGS. 5A-5B illustrate a process flow for forming an electrode according to some embodiments. In FIG. 5A, a layer 530 containing molybdenum can be formed on a substrate 500. The layer 530 can be formed directly on the substrate, e.g., in contact with the substrate. Alternatively, there can be other layers between the layer 530 and the substrate 500, such as other device layers. A layer 520 containing molybdenum oxide, such as molybdenum trioxide $MoO_3$ or a Magneli phase molybdenum oxide (e.g., $Mo_4O_{11}$, $Mo_8O_{23}$, or $Mo_9O_{26}$), can be formed on the layer 530, to be in contact with the layer 530. A dielectric layer 510 can be formed, e.g., deposited, on the layer 520, to be in contact with the layer 520.

The layer 520 can be non-uniformly deposited on the layer 530. For example, the layer 520 can be thicker in area 555, which is less critical in term of contact resistance with the dielectric layer 510. The layer 520 can be thinner in area 550, which is more critical in term of contact resistance with the dielectric layer 510.

The substrate and the layers formed thereon can be annealed, for example, to react molybdenum oxide in layer 520 with molybdenum in layer 530. In FIG. 5B, molybdenum dioxide 540 can be formed due to the reaction between molybdenum oxide in layer 520 and molybdenum in layer 530. There can be molybdenum oxide 525 in the composite layer, e.g., the layer formed from a combination of the layers 520 and 530. There can also be molybdenum oxide 527 at the interface 555 of the layer molybdenum dioxide 540 with the dielectric layer 510, which can lead to higher contact resistance at interface area 555. The molybdenum oxide 527 can formed due to the high amount of molybdenum oxide 520 in reacting with the low amount of molybdenum 520 at area 555. At area 550, there can no little or no molybdenum oxide, due to higher ratio of molybdenum and molybdenum oxide 527.

Since the contact resistance at area 555 is not overly critical, e.g., high contact resistance can be tolerated, the electrode 540/dielectric 510 stack can still function, e.g., the operation of the stack is not affected by the high contact resistance. The contact resistance between the electrode 540 and the dielectric 510 can be determined by the contact resistance at critical area 550.

Figure 6A:
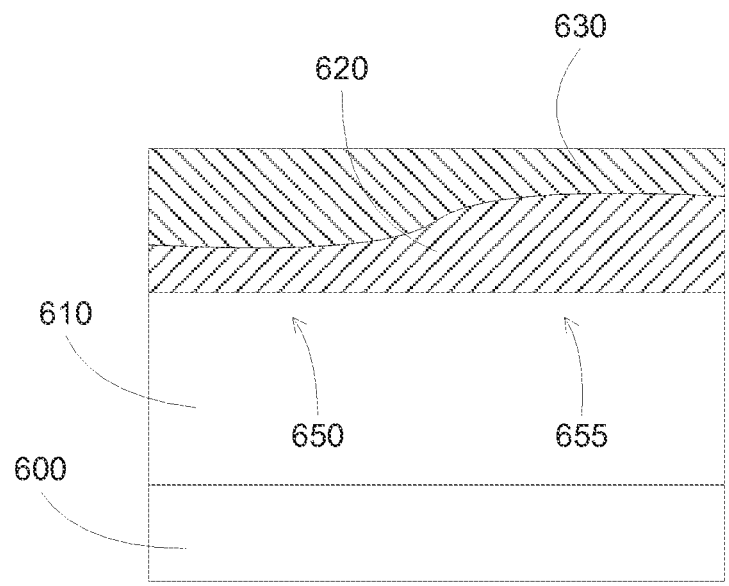
FIGS. 6A-6B illustrate a process flow for forming an electrode according to some embodiments.
Figure 6B:
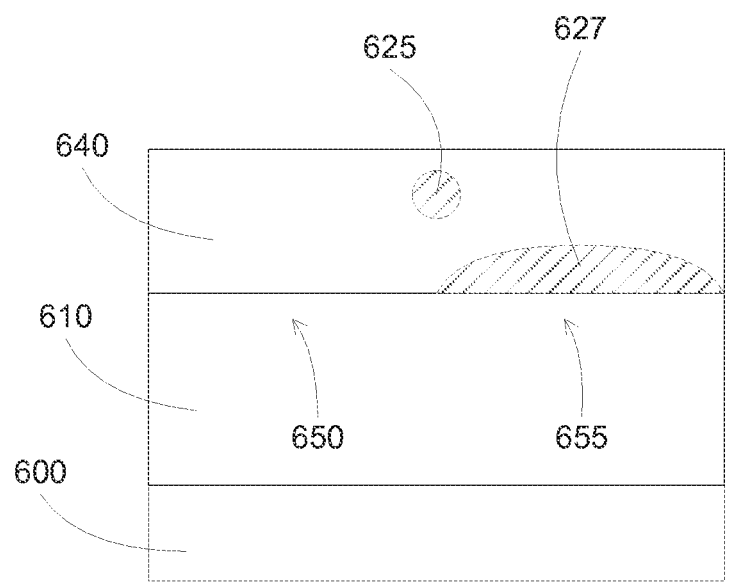

FIGS. 6A-6B illustrate a process flow for forming an electrode according to some embodiments. In FIG. 6A, a dielectric layer 610 can be formed, e.g., deposited, on a substrate 600. The dielectric layer 610 can be formed directly on the substrate, e.g., in contact with the substrate. Alternatively, there can be other layers between the dielectric layer 610 and the substrate 600, such as a bottom electrode. A layer 620 containing molybdenum oxide, such as molybdenum trioxide $MoO_3$ or a Magneli phase molybdenum oxide (e.g., $Mo_4O_{11}$, $Mo_8O_{23}$, or $Mo_9O_{26}$), can be formed on the dielectric layer 610, to be in contact with the dielectric layer 610. A layer 630 containing molybdenum can be formed on the layer 620, to be in contact with the layer 620.

The layer 620 can be non-uniformly deposited on the layer 630. For example, the layer 620 can be thicker in area 655, which is less critical in term of contact resistance with the dielectric layer 610. The layer 620 can be thinner in area 650, which is more critical in term of contact resistance with the dielectric layer 610. In addition, the layer 630 can be thinner in area 655, which is less critical in term of contact resistance with the dielectric layer 610.

The substrate and the layers formed thereon can be annealed, for example, to react molybdenum oxide in layer 620 with molybdenum in layer 630. In FIG. 6B, molybdenum dioxide 640 can be formed due to the reaction between molybdenum oxide in layer 620 and molybdenum in layer 630. There can be molybdenum oxide 625 in the composite layer, e.g., the layer formed from a combination of the layers 620 and 630. For example, if the thickness of the layer 620 is larger than twice the thickness of layer 620, e.g., there are excess molybdenum trioxide, since two molybdenum trioxide molecules can react with a molybdenum atom to form 3 molecules of molybdenum trioxide There can also be molybdenum oxide 627 at the interface 655 of the layer molybdenum dioxide 640 with the dielectric layer 610, which can lead to higher contact resistance at interface area 655. The molybdenum oxide 627 can formed due to the high ratio of molybdenum oxide 620 and molybdenum 620 at area 655. At area 650, there can no little or no molybdenum oxide, due to higher ratio of molybdenum and molybdenum oxide 627.

Since the contact resistance at area 655 is not overly critical, e.g., high contact resistance can be tolerated, the electrode 640/dielectric 610 stack can still function, e.g., the operation of the stack is not affected by the high contact resistance. The contact resistance between the electrode 640 and the dielectric 610 can be determined by the contact resistance at critical area 650.

In some embodiments, devices can be fabricated using the molybdenum-containing electrode. For example, a capacitor structure, including two electrodes sandwiching a dielectric layer, can be formed as discussed above. Similarly, other devices can incorporate the electrode, such as transistor devices in a planar metal oxide semiconductor field effect transistor (MOSFET) or in a fin field effect transistor (finFET).

Figure 7A:
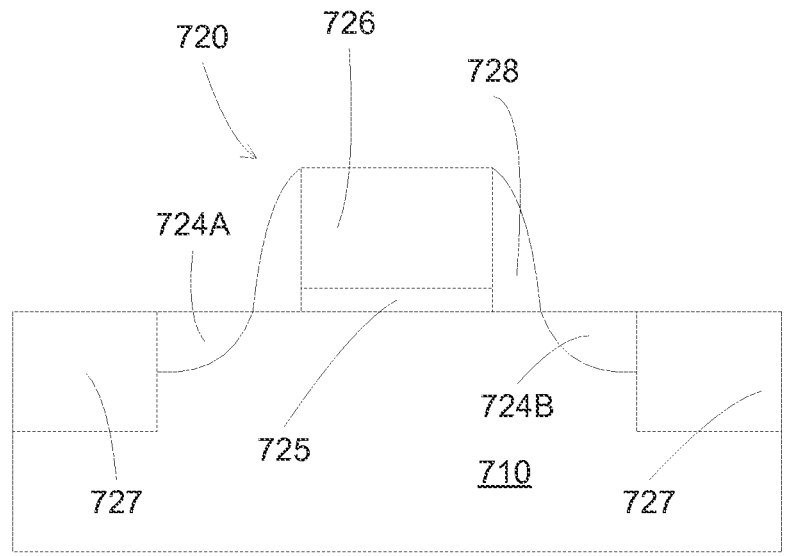
FIGS. 7A-7B illustrate a process flow for forming an electrode according to some embodiments.

FIG. 7A illustrates an example of a MOSFET device according to some embodiments. A transistor structure 720 is formed on a substrate 710, including isolation regions 727 to isolate the neighboring devices, source and drain regions 724A and 724B sandwiching a gate electrode having a gate dielectric 725 and a gate conductor 726. Spacers 728 can cover the sidewalls of the gate electrode. The substrate can be a semiconductor substrate, or any substrates having a layer of semiconductor layer. For example, the substrate can be a single crystal silicon substrate. The substrate can be a silicon-germanium substrate, or can have a silicon germanium layer disposed on top. The substrate can also be a germanium substrate, or a silicon carbide substrate. The gate conductor can include a molybdenum-containing material as discussed above. A metal-oxide-semiconductor field effect transistor (MOSFET) structure is shown, but the invention is not so limited, and can include any transistor structure, such as bipolar transistors. In addition, the process flow can include a silicidation process for gate electrode and on source and drain regions.

Figure 7B:
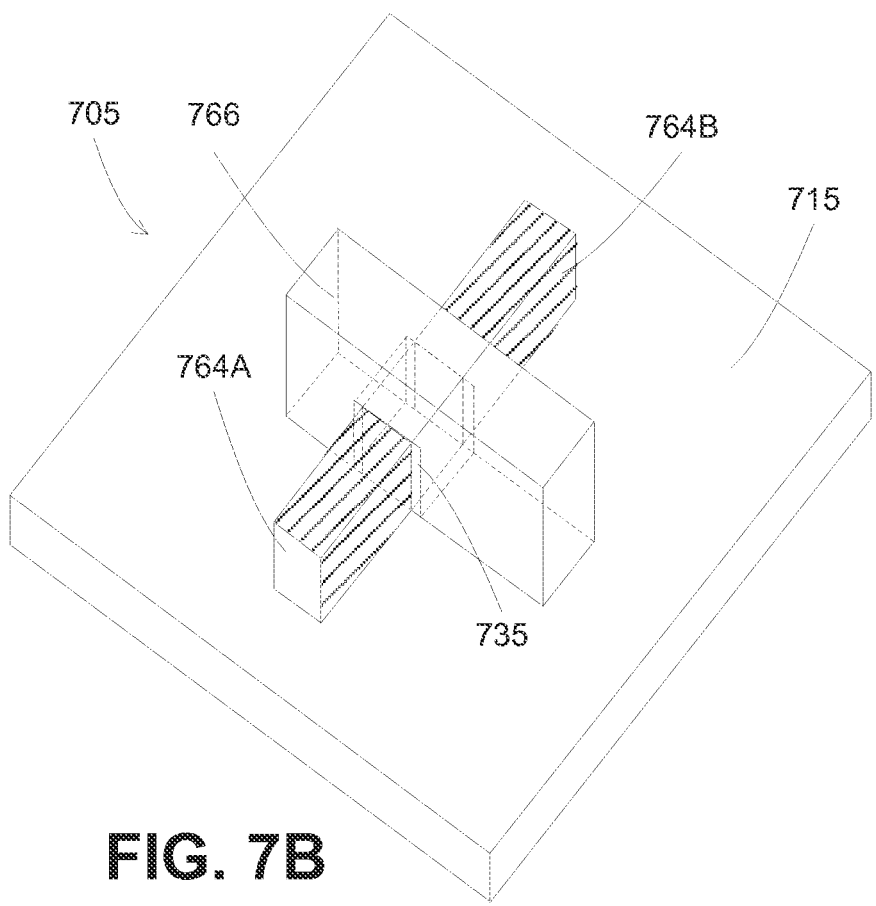

FIG. 7B illustrates an example of a finFET device according to some embodiments. A finFET device 705 having a semiconductor body having a fin shape formed on a substrate 715. Source/drain regions 764A/464B can be formed at opposite ends of the semiconductor body. A gate dielectric 735 can be formed on a portion between the source and drain regions, which becomes a channel region of the finFET device. The gate dielectric 735 can include a high dielectric constant material, such as $TiO_2$, grown through a seed layer of $TiO_2$ nanorods. A gate electrode 766 can be formed on the gate dielectric 725. The gate conductor can include a molybdenum-containing material as discussed above. The source/drain regions can be doped, for example, with p-type or n-type dopants to form p-type or n-type devices. The doping of the source/drain regions can be accomplished by doping the whole semiconductor body, using the gate electrode to act as a mask to prevent the channel region from being doped. As shown, the gate dielectric and the gate electrode surround the channel on two sides, forming a double-gate finFET device.

In some embodiments, methods to form memory devices can be provided. The methods can include depositing a first electrode, a second electrode, and a dielectric layer between the two electrodes. Either the first, the second, or both electrodes can include a layer of molybdenum oxide and a layer of molybdenum. The two layers can be annealed to form a composite layer of molybdenum dioxide, together with excess molybdenum oxide and little or no molybdenum. The heat treatment can include rapid thermal annealing or plasma treatment, such as a rapid thermal anneal in temperatures between 200 and 700 C, plasma oxygen anneal, and/or in-situ annealing after deposition.

Figure 8:
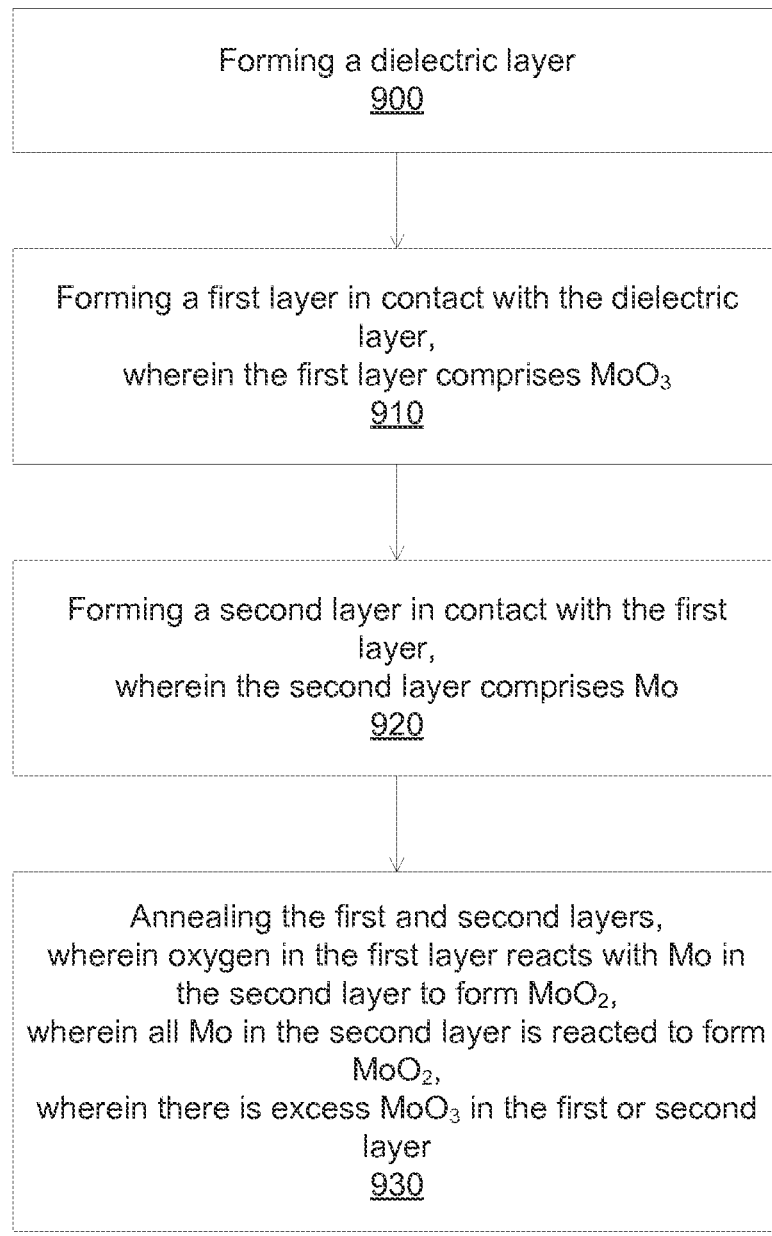
FIG. 8 illustrates a process flow for forming an electrode according to some embodiments.

FIG. 8 illustrates a flowchart for forming a memory element according to some embodiments. The described flowchart is a general description of techniques used to form the memory element described above. The flowchart describes techniques for forming a memory element generally including two electrodes and one or more dielectric layers disposed therebetween. Although certain processing techniques and specifications are described, it is understood that various other techniques and modifications of the techniques described herein may also be used.

In operation 800, a dielectric layer is formed. The dielectric layer can be operable as a high-k dielectric layer in a DRAM device, or a switching layer in a ReRAM device. The dielectric layer can include a metal oxide, such as $ZrO_2$, $HfO_2$, $Al_2O_3$, $TiO_2$, or ZnO. The thickness of the dielectric layer can be between 1 nm and 10 nm. An optional treatment can be performed after depositing the dielectric layer. The treatment can include a plasma treatment or a high temperature treatment in an oxidizing or reducing ambient. For example, the treatment can include a rapid thermal oxidation at 300 C in oxygen ambient. The treatment can be performed in-situ after the deposition of the first electrode layer. The treatment can include an oxygen radical anneal, e.g., plasma anneal in an oxygen ambient.

In some embodiments, the dielectric layer can be deposited by a PVD or ALD process. For example, an ALD process can include $O_3$ oxidant, at about 250-300 C deposition temperature, using tetrakis (ethylmethylamino) zirconium (TEMAZ), Tris (dimethylamino) cyclopentadienyl Zirconium, tetrakis (ethylmethylamino) hafnium (TEMAHf), tetrakis (dimethylamido) hafnium (TDMAHf) precursors.

In operation 810, a layer including molybdenum trioxide can be formed in contact with the dielectric layer. In operation 820, a layer including molybdenum can be formed in contact with the molybdenum trioxide-containing layer. The dielectric layer, the molybdenum trioxide-containing layer, and the molybdenum-containing layer can be formed on a substrate, for example, a silicon substrate that may include one or more layers already formed thereon. The three layers can form different configurations, with the molybdenum trioxide-containing layer in contact with the dielectric layer. For example, the dielectric layer can be formed on the molybdenum trioxide-containing layer, which can be formed on the molybdenum-containing layer. Alternatively, the molybdenum-containing layer can be formed on the molybdenum trioxide-containing layer, which can be formed on the dielectric layer.

The molybdenum trioxide-containing electrode layer or the molybdenum-containing layer can be formed using PVD or other processes. For example, the layers can be sputtered by bombarding a metal target at 150-500 W with a pressure of 2-10 mTorr for a deposition rate of approximately 0.5-5 Å/s. These specifications are given as examples, the specifications can vary greatly depending on the material to be deposited, the tool used to deposit the material, and the desired speed of deposition. The duration of the bombardment can determine the thickness of the electrode. Other processing techniques, such as ALD, pulsed layer deposition (PLD), CVD, evaporation, etc. can also be used to deposit the molybdenum trioxide-containing electrode layer or the molybdenum-containing layer. A capping layer can be added before a heat treatment.

In operation 830, a heat treatment, e.g., an anneal process, can be performed after forming the layers. The treatment can include a plasma treatment or a high temperature treatment. For example, the treatment can include a rapid thermal process at 300 C in an oxidizing or reducing ambient. In the heat treatment, a composite layer can be formed by the combination of the molybdenum trioxide-containing layer with the molybdenum-containing layer, e.g., the oxygen in the molybdenum trioxide-containing layer can react with molybdenum in the molybdenum-containing layer to form $MoO_2$. In some embodiments, all molybdenum, or substantially all molybdenum, e.g., less than 1 at % of molybdenum remaining, in the molybdenum-containing layer can be reacted to form $MoO_2$. In some embodiments, there can be excess $MoO_3$ in the composite layer. The excess $MoO_3$ can be less than 5 at %. In some embodiments, the number of molybdenum atoms in the first layer is between 100% and 250% of the number of molybdenum atoms in the second layer. Alternatively, the number of molybdenum atoms in the first layer is 210% of the number of molybdenum atoms in the second layer plus half a monolayer of $MoO_3$.

In some embodiments, the method can further include forming a cap layer on the second layer before the annealing process. The cap layer can include silicon nitride, and can serve to prevent oxygen incorporation to the first or second layer.

In some embodiments, the method can further include forming another electrode, disposed in contact with the dielectric layer and in opposite side of composite layer having molybdenum dioxide. The second electrode layer can include conductive materials such as Pt, Au, Ag, W, $MoO_2$, $MoSi_xO_y$, TiN, Al, Hf, Zr, Eu, La, or their alloys. The second electrode can have any thickness, for example between about 5 nm and about 500 nm thick.

The second electrode layer can be formed using PVD or other processes. For example, the second electrode can be sputtered by bombarding a metal target at 150-500 W with a pressure of 2-10 mTorr for a deposition rate of approximately 0.5-5 Å/s. These specifications are given as examples, the specifications can vary greatly depending on the material to be deposited, the tool used to deposit the material, and the desired speed of deposition. The duration of the bombardment can determine the thickness of the electrode. Other processing techniques, such as ALD, pulsed layer deposition (PLD), CVD, evaporation, etc. can also be used to deposit the second electrode.

In some embodiments, the second electrode layer can include a second composite layer, formed by annealing a second molybdenum trioxide-containing electrode layer and a second molybdenum-containing layer. The second composite layer can include $MoO_2$ and $MoO_x$ with x greater than 2 and less than or equal to 3, with little or no molybdenum.

Figure 9:
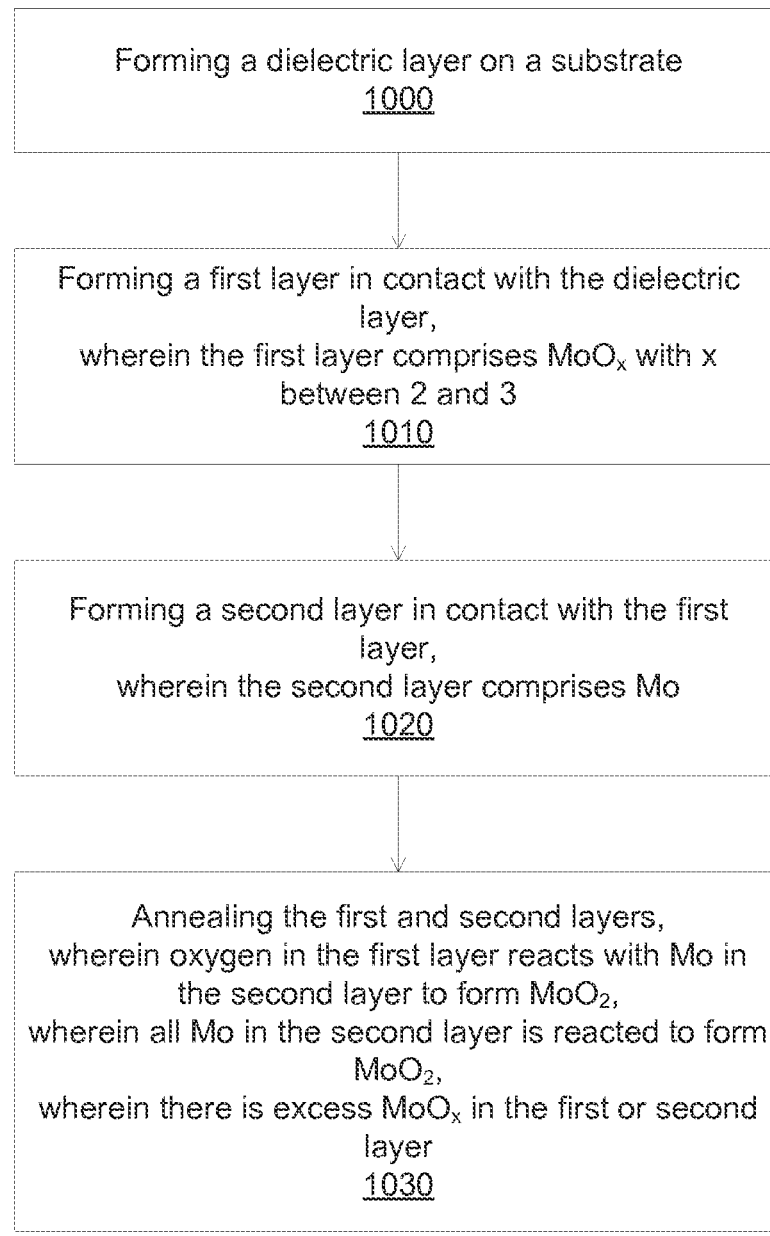
FIG. 9 illustrates a flowchart for forming a memory element according to some embodiments.

FIG. 9 illustrates a flowchart for forming a memory element according to some embodiments. In operation 900, a dielectric layer is formed. The dielectric layer can include a metal oxide, such as $ZrO_2$, $HfO_2$, $Al_2O_3$, $TiO_2$, or ZnO. The thickness of the dielectric layer can be between 1 nm and 10 nm. An optional treatment can be performed after depositing the dielectric layer. The treatment can include a plasma treatment or a high temperature treatment in an oxidizing or reducing ambient.

In operation 910, a layer including molybdenum oxide $MoO_x$, with x between 2 and 3, can be formed in contact with the dielectric layer. In some embodiments, the molybdenum oxide layer can include Magneli phase molybdenum oxide, such as $Mo_4O_{11}$, $Mo_8O_{23}$, or $Mo_9O_{26}$. Alternatively, the molybdenum oxide layer can also include $MoO_3$. In operation 920, a layer including molybdenum can be formed in contact with the molybdenum oxide-containing layer. The dielectric layer, the molybdenum oxide-containing layer, and the molybdenum-containing layer can be formed on a substrate, for example, a silicon substrate that may include one or more layers already formed thereon. The dielectric layer can be formed on the molybdenum oxide-containing layer, which can be formed on the molybdenum-containing layer. Alternatively, the molybdenum-containing layer can be formed on the molybdenum oxide-containing layer, which can be formed on the dielectric layer.

In operation 930, a heat treatment, e.g., an anneal process, can be performed after forming the layers. The treatment can include a plasma treatment or a high temperature treatment. For example, the treatment can include a rapid thermal process at 300 C in an oxidizing or reducing ambient. In the heat treatment, a composite layer can be formed by the combination of the molybdenum oxide-containing layer with the molybdenum-containing layer, e.g., the oxygen in the molybdenum oxide-containing layer can react with molybdenum in the molybdenum-containing layer to form $MoO_2$. In some embodiments, all molybdenum, or substantially all molybdenum, e.g., less than 2 at % of molybdenum remaining, in the molybdenum-containing layer can be reacted to form $MoO_2$. In some embodiments, there can be excess $MoO_3$ or $MoO_x$, such as Magneli phases $Mo_4O_{11}$, $MO_8O_{23}$, or $Mo_9O_{26}$, in the composite layer. The excess $MoO_3$ or $MoO_x$ can be less than 5 at %. In some embodiments, the number of molybdenum atoms in the first layer is between 100% and 250% of the number of molybdenum atoms in the second layer. Alternatively, the number of molybdenum atoms in the first layer is 210% of the number of molybdenum atoms in the second layer plus half a monolayer of $MoO_3$ or $MoO_x$.

In some embodiments, the method can further include forming a cap layer on the second layer before the annealing process. The cap layer can include silicon nitride, and can serve to prevent oxygen incorporation to the first or second layer.

In some embodiments, the second electrode layer can include a second composite layer, formed by annealing a molybdenum trioxide-containing electrode layer or a second molybdenum oxide-containing electrode layer and a second molybdenum-containing layer. The second composite layer can include $MoO_2$ and $MoO_x$ with x greater than 2 and less than or equal to 3, with little or no molybdenum. The second composite layer can include magneli phase molybdenum oxide such as $Mo_4O_{11}$, $Mo_8O_{23}$, or $Mo_9O_{26}$.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method comprising:
   forming a dielectric layer on a substrate;
   forming a first layer in contact with the dielectric layer, wherein the first layer comprises $MoO_3$;
   forming a second layer in contact with the first layer, wherein the second layer comprises Mo;
   annealing the first and second layers; and
   forming a third layer in contact with a side of the dielectric layer opposite the first layer,
   wherein the third layer comprises $MoO_2$ and $MoO_x$ with x greater than 2 and less than or equal to 3.

2. A method as in claim 1 further comprising: capping the second layer before annealing the first and second layers.

3. A method as in claim 1 wherein the number of molybdenum atoms in the first layer is between 100% and 250% of the number of molybdenum atoms in the second layer.

4. A method as in claim 1 wherein the number of molybdenum atoms in the first layer is 210% of the number of molybdenum atoms in the second layer plus half a monolayer of $MoO_3$.

5. A method as in claim 1, wherein there is no elemental Mo in the third layer.

6. A method as in claim 1 further comprising:
   forming a fourth layer in contact with the third layer, wherein the fourth layer comprises Mo.

7. A method comprising:
   forming a dielectric layer on a substrate;
   forming a first layer in contact with the dielectric layer, wherein the first layer comprises $MoO_x$ with x between 2 and 3;
   forming a second layer in contact with the first layer, wherein the second layer comprises Mo;
   annealing the first and second layers;
   forming a third layer in contact with a side of the dielectric layer opposite the first layer,
   wherein the third layer com rises $MoO_2$ and $MoO_x$ with x greater than 2 and less than or equal to 3.

8. A method as in claim 7 wherein the dielectric layer comprises a metal oxide material.

9. A method as in claim 7 wherein the number of molybdenum atoms in the first
   layer is between 100% and 250% of the number of molybdenum atoms in the second layer.

10. A method as in claim 7 wherein the first layer comprises $Mo_4O_{11}$, $Mo_8O_{23}$, or $Mo_9O_{26}$.

11. A method as in claim 7 wherein there is $Mo_4O_{11}$, $Mo_8O_{23}$, or $Mo_9O_{26}$ in the first
   or second layer.

12. A method as in claim 7 further comprising
   forming a fourth layer in contact with the third layer
   wherein the forth layer comprises Mo.

\* \* \* \* \*